(12) United States Patent
Endres et al.

(10) Patent No.: US 6,431,920 B1
(45) Date of Patent: *Aug. 13, 2002

(54) APPARATUS FOR ASSEMBLING ELEMENTS ON A PRINTED CIRCUIT BOARD

(75) Inventors: Klaus Endres, Maintal; Manfred Lange, Riedstadt; Werner Radde, Babenhausen; Michael Sturm, Griesheim; Ralf Wägner, Otzberg; Rudolf Kowollik, Langen, all of (DE)

(73) Assignee: Weidmüller Interface GmbH, Detmold (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/742,089

(22) Filed: Dec. 22, 2000

(51) Int. Cl.[7] .................................................. H01R 9/22
(52) U.S. Cl. .......................................................... 439/717
(58) Field of Search .......................... 439/78, 680, 681, 439/590, 594, 717, 937, 940

(56) References Cited

U.S. PATENT DOCUMENTS

| | | | | |
|---|---|---|---|---|
| 4,425,018 A | * | 1/1984 | Stenz | 439/716 |
| 4,693,532 A | * | 9/1987 | Colleran et al. | 439/594 |
| 5,066,236 A | * | 11/1991 | Broeksteeg | 439/79 |
| 5,129,831 A | * | 7/1992 | Locati | 439/79 |
| 5,443,404 A | * | 8/1995 | Matsuoka | 439/717 |
| 5,451,174 A | * | 9/1995 | Bogursky et al. | 439/876 |
| 5,613,882 A | * | 3/1997 | Hnatuck et al. | 439/686 |
| 5,951,306 A | * | 9/1999 | Millhimes | 439/79 |
| 6,010,373 A | * | 1/2000 | Donahue | 439/717 |

* cited by examiner

Primary Examiner—Brian Sircus
Assistant Examiner—Thanh-Tam Le
(74) Attorney, Agent, or Firm—Lawrence E. Laubscher, Sr.

(57) ABSTRACT

A sectional mounting connector is provided for mounting a component on a printed circuit board, characterized that the sections of the component are arranged end to end in interlocking relation.

11 Claims, 5 Drawing Sheets

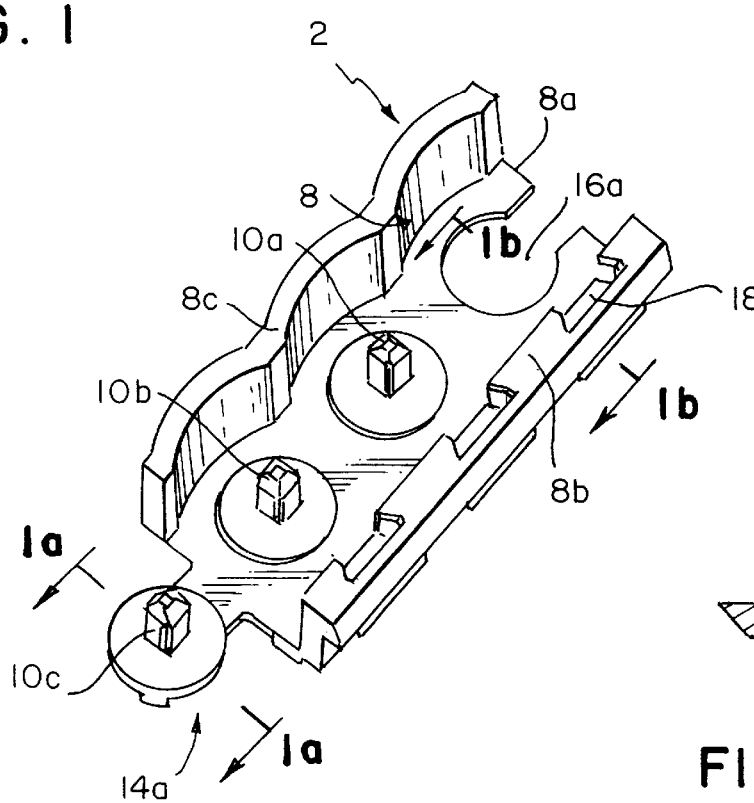
FIG. 1
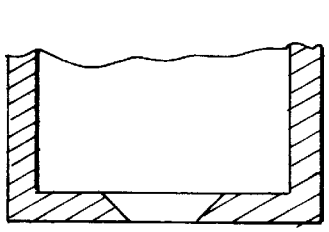
FIG. 1b
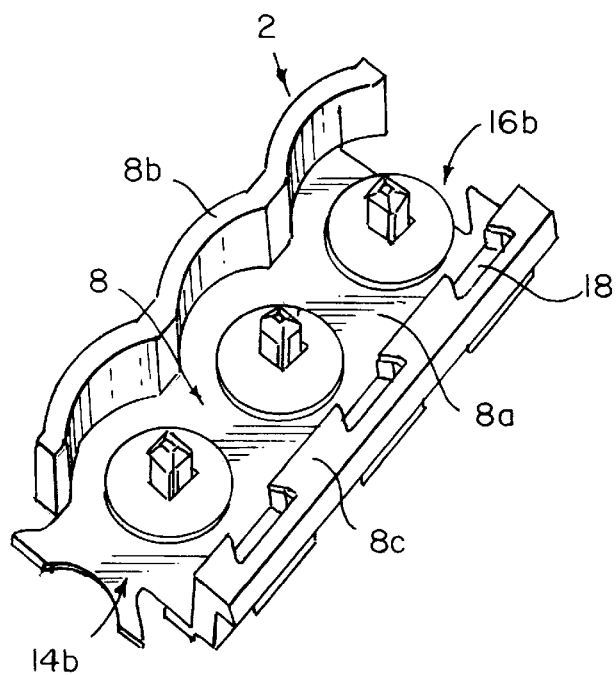
FIG. 1a
FIG. 2

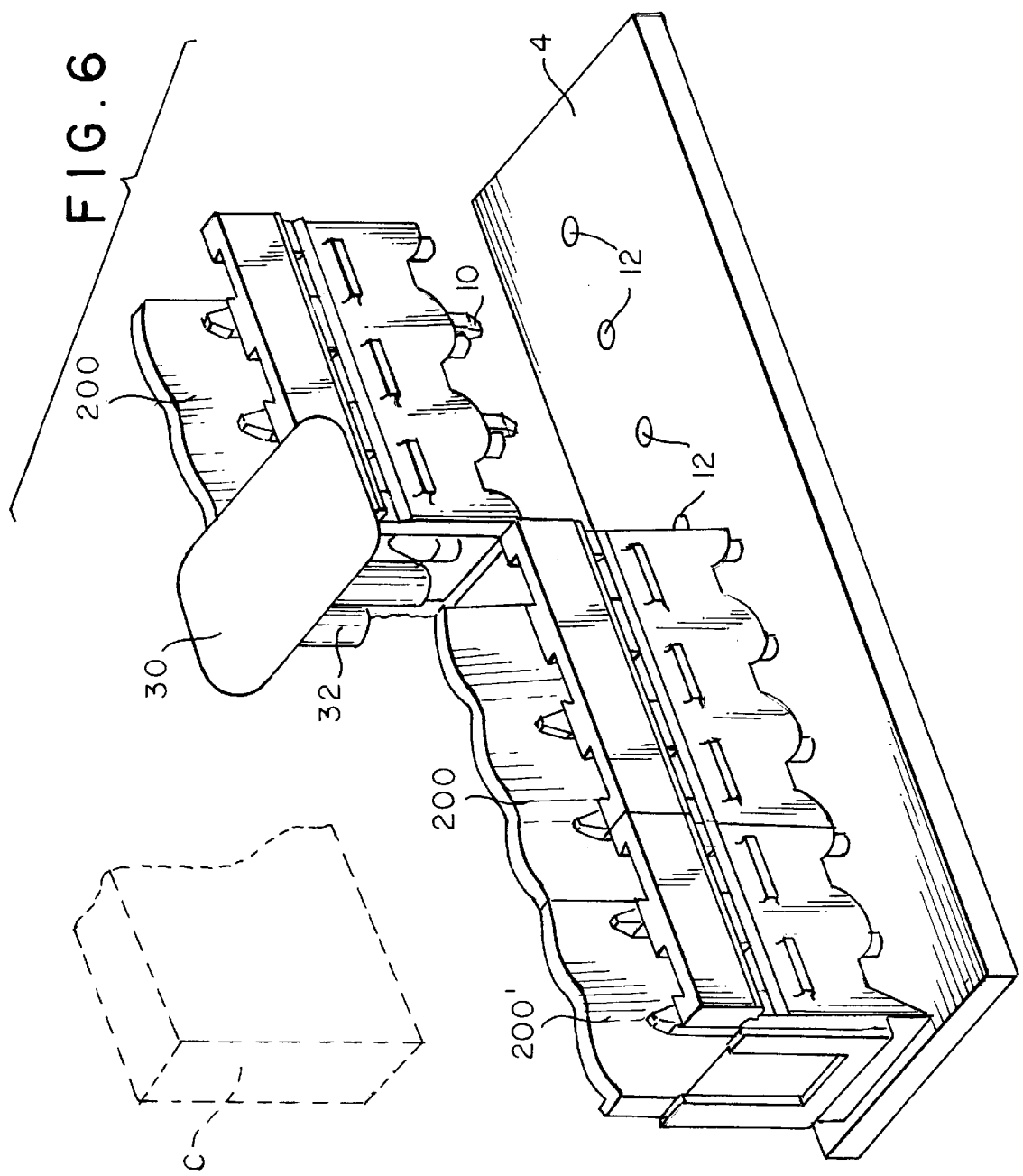

APPARATUS FOR ASSEMBLING ELEMENTS ON A PRINTED CIRCUIT BOARD

FIELD OF THE INVENTION

A sectional connector such as a pinstrip, and method are disclosed for mounting an active or passive component on a printed circuit board.

BACKGROUND OF THE INVENTION

Brief Description of the Prior Art

Requirements for the miniaturization and function integration of components keep growing in connection with the production of electrical and electronic structural members—for example, printed circuit boards for applications in telecommunications and data communication. The plug connectors of the structural members or printed circuit boards are also subject to these requirements. In many practical applications, one uses plug connectors or pin strips with a number of pins ranging between 2 and 24. But in the meantime, there are also requirements for pin strips that have pin numbers of 400 to 800 contacts per 100 mm of card length or printed circuit board length. According to the state of the art, even such high-pole pin strips are mounted on a printed circuit board after their production as a whole. In order to limit the wide variety of models (logistics), it has been proposed to assemble high-numbered pole pin strips from multi-pole strips. Here, of course, one encounters a problematical effect: When the individual plug pin or pins are not exactly aligned in a row, it is very difficult, if entirely impossible to accomplish assembly on the printed circuit board and to connect a plug socket to the plug connector. This is because the plug pins do not exactly engage the corresponding openings of the plug socket. Furthermore, pin strips with pins that are not exactly aligned straight impart the optical impression of deficient quality even when the functionality is still guaranteed.

Against this background of the above-described problems, the present invention was developed to provide a process for the assembly of electrical structural members on a printed circuit board by means of which one can, in a simple and uncomplicated, fashion ensure a most extensively exact alignment of the structural member in a straight row. The invention is furthermore intended to create a corresponding structural member.

SUMMARY OF THE INVENTION

Accordingly, a primary object of the present invention is to provide a sectional connector and method for connecting a active or passive component to a printed circuit board, characterized in that the connector includes a plurality of sections that are connected end-to-end in an aligned manner and are mounted on a rectangular printed circuit board.

According to another object of the invention, a process is provided for the assembly of electrical structural members on a printed circuit board, where a superordinate, common structural member is assembled from the structural member sections or segments directly upon the printed circuit board, whereupon a following structural member section is aligned on the printed circuit board along a structural member section that has beforehand been stuck on the printed circuit board. The invention thus involves the creation of an overlapping structural member that is not outside the printed circuit board and that does not place said structural member as a whole on the printed circuit board. Instead, it assembles an overlapping structural member only on the printed circuit board. Advantageously, the structural member sections are positioned on the printed circuit board by means of a centering device and are aligned in a row on the printed circuit board. The most varied elements might be conceived as a centering device: for instance, centering elements on the structural member but also centering elements on the assembly insertion head, on the printed circuit board, etc., can be provided.

Particularly preferred components are a printed circuit board clamp segment, socket strip segments or pin strip segments. The structural members include multi-pole printed circuit board clamps, socket strips or pin strips.

According to the method of the invention, the particular structural members are assembled on the printed circuit board by using the interlocking segments themselves. This variant of the invention offers a special advantage: With the help of the segments and the process of the present invention, one can fashion elements, in particular, pin strips of any desired length without any need for any stockpiling or supply of various supply roles on the automatic placement machine. A single placement insertion roll instead facilitates the formation of structural members of any desired length and any desired width (assuming there is a corresponding geometric layout with lateral centering elements). Here, one can always ensure a particularly exact alignment of the plug pins in a row and the uncomplicated action of placing the structural member segments upon the printed circuit board.

According to another object of the invention, the segments or sections have centering elements that are fashioned upon the segments as centering device; with the help of these centering elements, the segments can be aligned in a row as they are lined up next to each other on the printed circuit board. For this purpose, one may use, for instance, mutually corresponding dovetail recesses and projections and/or mutually corresponding T-shaped and/or V-shaped and/or circular and/or conical, mutually engaging recesses and projections and/or cooperating grooves and springs and/or other puzzle-like recesses and projections. In this embodiment of the invention, the pin strip segment is thus fashioned in a special form.

According to another object of the invention, the centering elements for the structural member segments comprise frames or combs or pick-and-place pads that can be joined to the structural member segments, in particular, the pin strip segments, and that can be separated from the latter. This simplifies the design of the individual pin strip segments because they do not have to have any additional centering elements of their own. The pick-and-place pad is often needed as fitting during assembly so that the insertion or pick-and-place head can engage the corresponding structural member.

In another modification of the invention, the centering elements and/or centering recesses are made as boreholes, as clearances or recesses and mutually corresponding projections on the structural members and/or the printed circuit boards.

According to a further object of the invention, the centering device is made on the pick-and-place head of a pick-and-place insertion tool and is used for grasping a structural member segment that is already mounted on the printed circuit board upon the depositing of another structural member segment on the printed circuit board, and thus to align the additional structural member segment to be stuck on the printed circuit board by means of self-alignment of the pick-and-place head upon grasping the already mounted structural member segment. The invention thus also creates an advantageous innovation in the field of pick-and-place heads for pick-and-place machines with respect to printed circuit boards. Advantageously, the lug with the projection has a conical or tapered area that secures the assembly procedure by way of a preliminary centering action. Also possible in the end is a design for the placement and/or joining of laterally closed structural member segments, in particular, of pin strip segments, as well as contour fashioning or shaping, which will be adapted to the contour of a structural member that is to be received.

BRIEF DESCRIPTION OF THE DRAWINGS

Other objects and advantages of the invention will become apparent from a study of the following specification when viewed in the light of the accompanying drawings, in which:

FIGS. 1–3 are perspective views of three embodiments of sections from which the structural mounting component are formed;

FIGS. 5 and 6 are perspective views illustrating two embodiments of transport and assembly heads for successively mounting the connector sections on a printed circuit board.

DETAILED DESCRIPTION

Figure 4A:
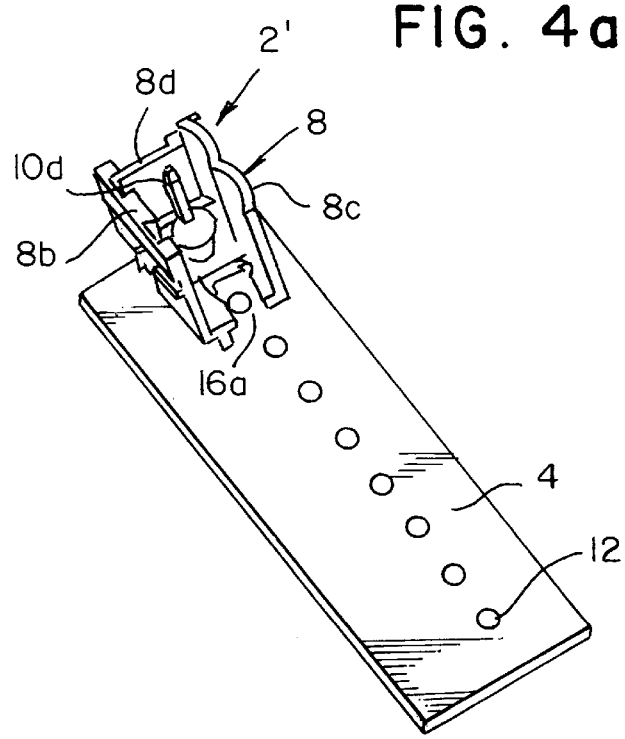
FIGS. 4a and 4b are perspective views illustrating the method of mounting an end section and a plurality of regular sections in interlocking end-to-end relation.
Figure 4B:
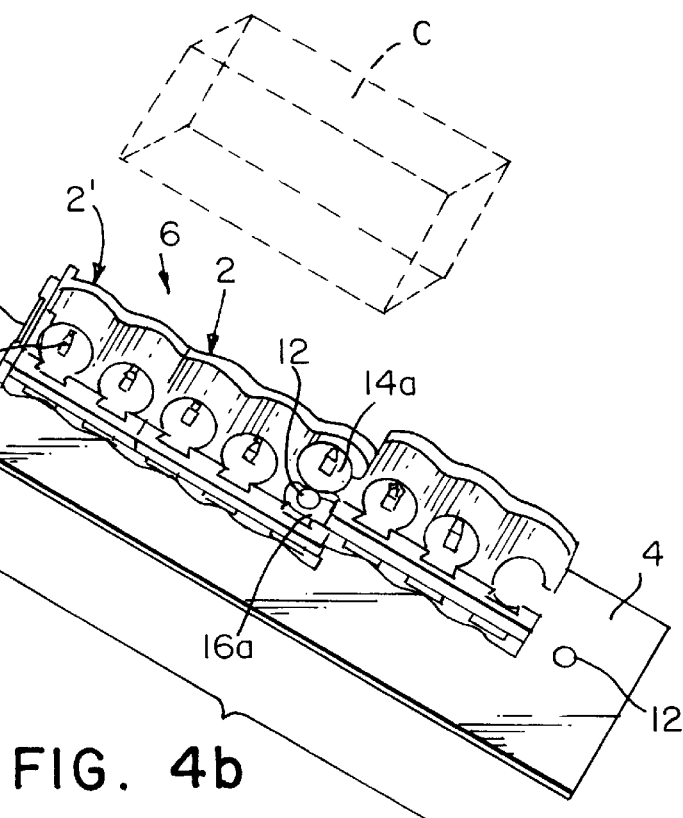

Referring first more particularly to FIGS. 1 and 4, the sectional connector includes a plurality of sections 2 that are arranged end-to-end relative to an end section 2' that is initially mounted on the printed circuit board 4, as shown in FIG. 4(a). As will be described in greater detail before, the sections 2 are successively connected in end-to-end interlocking relation from the first end segment 2'.

As shown in FIG. 1, the pinstrip section 2 has a generally U-shaped cross section and includes a bottom wall 8a and a pair of side walls 8b and 8c. At its opposite ends, the section 2 is provided with a male lug 14a, and at the opposite end with a female recess 16a adapted to receive the male lug projection from the next successive connector section. The bottom wall is provided with a plurality of longitudinally spaced mounting pins 10a, 10b, 10c, the last mounting pin 10c being carried by the male interlocking projection 14a As shown in FIGS. 1a and 1b, the male projection 14a in the female recess 16a have tapered walls, thereby to center the relative interlocking means during the vertical insertion of the male projection 14a into the female recess 16a. As will be explained in greater detail below, one of the vertical side walls is provided with at least one vertical guide groove 18 that is utilized during the assembly of the interlocking means of the respective sections relative to each other Mounting pins 10a, 10b, and 10c extend upwardly between the vertical side walls of the housing, and downwardly from the bottom wall 8a of the housing 8.

Referring to FIG. 4, it will be seen that the equally-spaced mounting pins extend within corresponding equally-spaced centering openings 12 arranged in longitudinally-spaced relation on the printed circuit board 4. As shown in FIG. 4(a), the end section 2', which carries a single pin 10d—is mounted on the printed circuit board 4, and an end closure wall 8d is provided at the end of the section 8. The next sections 2—which contain a plurality of pins—are successively connected in line with the end section 2', the interlocking elements 14a and 16a at the adjacent ends of the sections cooperating to effect interlocking connection of the sections. Furthermore, as each section is connected to the previous section in an interlocking manner, the mounting pins 10 extend downwardly into the corresponding openings 12 contained in the printed circuit board. Once all of the sections of the connector are mounted on the printed circuit board 4, the active or passive component or module C may be inserted downwardly between the vertical side walls of the sectional connecter.

Figure 3:
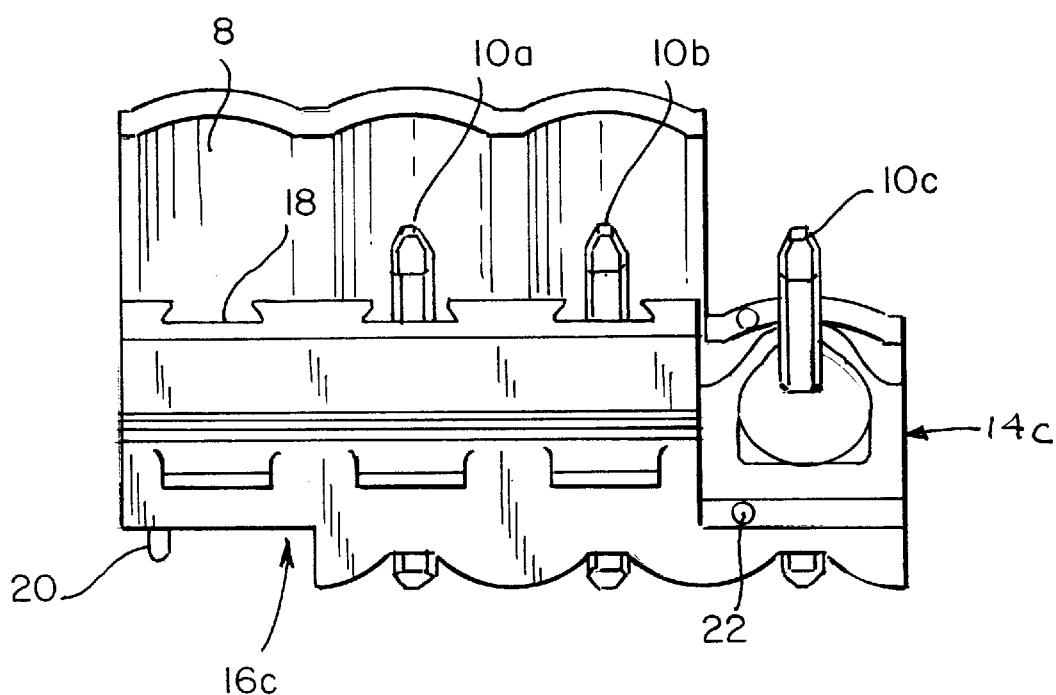

In the modification of FIG. 2, the male and female interlocking members have the form of non-circular male and female connecting means 14b and 16b, respectively, thereby to prevent any pivotal displacement of successive sections relative to each other. In the embodiment of FIG. 3, the male projection 14c extends the width of the body member 8, and at the other end, the body includes a recess 16c that receives the projection 14c from the adjacent section. A downwardly extending locking pin 20 extends within the recess for engagement with the corresponding recess 22 contained in the adjacent end of the next section.

Figure 5:
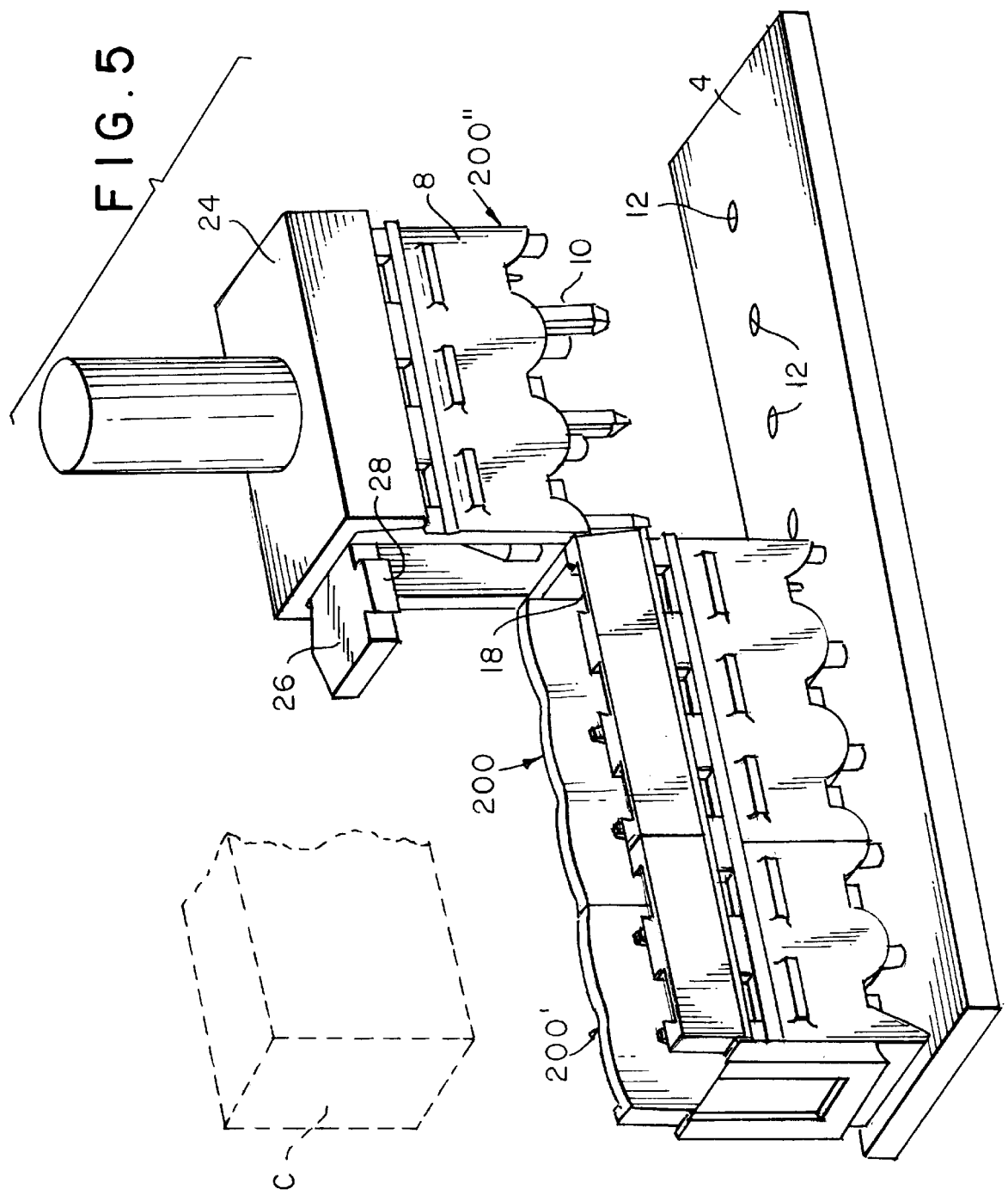

Referring to FIG. 5, the end section 200' and the next section 200 are mounted on the printed circuit board 4, and the housing 8 of the next section 200" is carried by a transporting and mounting head 24 that is provided at its one end with a centering lug 26 having a lateral projection 28 adapted to extend within the guide groove 18 provided on the adjacent end of the previously mounted section 200. Thus, when the insertion head 24 is displaced toward the printed circuit board 4, the centering lug 28 enters between the sidewalls of the section 200, and the lateral projection 28 extends within the guide groove 18, thereby to align the subsequent section 200" with the previously mounted section 200, further effecting alignment of the mounting pins 10 with the equally-spaced openings 12 contained in the printed circuit board 4.

In the modification of FIG. 6, the handling pad 30 that carries the third section 200" is provided with downwardly depending feet 32 that extend between the side walls of the section 200, thereby to guide the section 200 as it is being lowered toward its mounted position on the printed circuit board 4.

While in accordance with the provisions of the Patent Statutes the preferred form and embodiment of the invention have been illustrated and described, it will be apparent to those skilled in the art that various changes may be made without deviating from the inventive concepts set forth above.

What is claimed is:

1. A section connector for mounting a component (C) on a rectangular printed circuit board (4) containing a plurality of equally-spaced alignment openings (12) arranged in a longitudinal row, said connector comprising:

(a) a plurality of connector sections (2; 200) arranged in aligned end-to-end relation, at least one of said sections being an end section (2'), each of said sections having a generally U-shaped cross-sectional configuration and including a horizontal bottom wall (8a), and a pair of vertical side walls (8b, 8c), said end section having a transverse end wall (8d);

(b) the bottom walls of successive pairs of said sections including at their adjacent ends interlocking means (14, 16) for connecting said sections together to form a connector assembly;

(c) each of said sections including mounting means (10) adapted for cooperation with said alignment openings to mount said section in centered relation on the printed circuit board, said mounting means including a plurality of vertical mounting pins (10) that extend orthogonally downwardly from said bottom wall for insertion within corresponding ones of said printed circuit openings (12), respectively, said mounting pins extending upwardly from said bottom wall between said connector section side walls, the mounting pins of said connector assembly being equally spaced throughout the length of the assembly.

2. A sectional connector is defined in claim 1, wherein said interlocking means include integral cooperating non-circular male (14) and female (16) end portions arranged at the adjacent ends of the associated pair of sections, respectively.

3. A sectional connector as defined in claim 2, wherein said male and female end portions have mutually adjacent wall surfaces that are tapered in transverse cross-section to automatically align successive sections collinearly as the sections are successively connected together by said interlocking means.

4. A sectional connector as defined in claim 1, wherein said male end portion (14c) has a width that corresponds generally with the width of the section; and further wherein said female end portion includes a recess (16c) for receiving said male end portion; and further including connecting pin (20) and bore (22) means for connecting together the cooperating male and female end portions of each successive pair of sections.

5. A sectional connector as defined in claim 4, wherein at least one of said mounting means (10) is carried by said male end portion (14a, 14b, 14c) for cooperation with a corresponding mounting opening (12) contained in the printed circuit board, respectively.

6. A sectional connector as defined in claim 1, wherein at least one of said side walls contains on its interior wall surface a guide groove (G) normal to said bottom wall, and further including handling means (24) for transporting and positioning a section for mounting on the printed circuit board in end-to-end alignment with a previously mounted section.

7. A sectional connector as defined in claim 6, wherein said handling means includes a centering lug (2b) that extends within one end of a section to be transported, said centering lug including a lateral projection (28) that extends within said guide groove (G).

8. A method for mounting on a printed circuit board (4) containing a plurality of equally-spaced longitudinally arranged centering openings (12) a sectional component consisting of plurality of pinstrip structural sections (2,2') each having a U-shaped cross-sectional configuration including a horizontal bottom wall and a pair of vertical side walls, comprising:

(a) initially mounting a first one of said structural sections (2') at a desired location of the printed circuit board;

(b) aligning a second structural section (2) in end-to-end relation relative to said first structural section; and (c) connecting the adjacent end portions of the bottom walls of said first and second sections by interlocking puzzle-like male and female connections while simultaneously mounting said second structural section on said printed circuit board, thereby to form an assembly of said sections, said assembly having throughout its length a plurality of equally spaced mounting pins (10) that extend downwardly from said sections into corresponding ones of said centering openings, respectively;

(d) said male and female connections including cooperating means (14a, 16a) at the adjacent ends of said structural sections for aligning the respective sections relative to each other during the alignment of the sections on the printed circuit board.

9. The mounting method as defined in claim 8, wherein said second structural section (2) is carried by an assembly head device (24, 30).

10. The mounting method as defined in claim 9, wherein said assembly head device is guided by said firs t structural section during the mounting of said second structural section on said printed circuit board.

11. The mounting method as defined in claim 8, wherein the second structural section, during the mounting thereof on said printed circuit board, is carried by an assembly tool that cooperates with a previously mounted structural section, and further wherein said second structural section is guided by said previously mounted structural section.

* * * * *